(12) United States Patent
Sasaki et al.

(10) Patent No.: US 9,324,595 B2
(45) Date of Patent: Apr. 26, 2016

(54) LOAD PORT APPARATUS AND METHOD OF DETECTING OBJECT TO BE PROCESSED

(75) Inventors: Mutsuo Sasaki, Tokyo (JP); Hiroshi Igarashi, Tokyo (JP); Tomoshi Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 797 days.

(21) Appl. No.: 13/617,635

(22) Filed: Sep. 14, 2012

(65) Prior Publication Data

US 2013/0074615 A1    Mar. 28, 2013

(30) Foreign Application Priority Data

Sep. 26, 2011  (JP) ................................ 2011-208693

(51) Int. Cl.
*H01L 21/67* (2006.01)
*H01L 21/677* (2006.01)

(52) U.S. Cl.
CPC .... *H01L 21/67265* (2013.01); *H01L 21/67772* (2013.01)

(58) Field of Classification Search
CPC .................. H01L 21/67772; H01L 21/67265; H01L 21/67259; H01L 21/67778; H01L 21/67379; H01L 21/67763; H01L 21/67766; Y10S 414/135; E06B 3/50

USPC .................................. 206/710, 711; 414/411
See application file for complete search history.

(56) References Cited

U.S. PATENT DOCUMENTS

| 7,654,291 B2* | 2/2010 | Miyajima | H01L 21/67017 141/4 |
| 2008/0107506 A1* | 5/2008 | Babbs | H01L 21/67772 414/217 |

FOREIGN PATENT DOCUMENTS

JP         4246420         1/2009

* cited by examiner

*Primary Examiner* — Daniel S Larkin
*Assistant Examiner* — Jamar Ray
(74) *Attorney, Agent, or Firm* — Oblon, McClelland, Maier & Neustadt, L.L.P

(57) ABSTRACT

To enable appropriate wafer mapping in the case where a wafer is stored at the highest level, which is provided as a reserve, of a pod, a load port apparatus drives a mapping frame that supports a sensor by a first driving unit that drives the mapping frame in a first direction parallel to the direction along which wafers in the pod are arranged in an overlapping manner and a second driving unit that drives the mapping frame in a second direction that crosses the first direction in such a way as to form an acute angle in the side in which the sensor starts the mapping.

4 Claims, 7 Drawing Sheets

LOAD PORT APPARATUS AND METHOD OF DETECTING OBJECT TO BE PROCESSED

BACKGROUND OF THE INVENTION

1. Field of the Invention

The present invention relates to what is called a FIMS (Front-Opening Interface Mechanical Standard) system or a load port apparatus, which is used when wafers (which are objects to be processed) stored in the interior of an airtight transfer container called a pod are transferred between semiconductor processing apparatuses in a semiconductor manufacturing process etc. More specifically, the present invention relates to a load port apparatus characterized in its mapping system for detecting the presence/absence of wafers in the interior of a pod placed thereon and a what is called mapping method for detecting the presence/absence of objects to be processed such as wafers.

2. Description of the Related Art

A widely used method in semiconductor manufacturing processes is keeping a highly clean condition only in the interior of three spaces including the interior of processing apparatuses, the interior of a pod in which wafers are stored to enable transfer wafers between processing apparatuses, and a mini-environment (or small space) through which the wafers are transferred between the pod and each processing apparatus, thereby controlling the cleanliness throughout the process. The pod as such is a container composed of a body in which wafers are stored and that has an opening provided on one side thereof through which wafers are brought into/out of it, and a lid for closing the opening to seal the interior space of the pod. The mini-environment has an opening portion that can be opposed to the opening of the pod, and a second opening portion provided on the semiconductor processing apparatus side opposite to the opening portion.

The load port apparatus includes a member or a wall called "side base" that constitutes a partition on which the opening portion is provided, a door that closes the opening portion, a door driving mechanism that control the motion of the door, and a support table on which the pod is to be placed. The support table can support the pod in such a way that the opening of the pod and the opening portion are opposed to each other. The support table is adapted to move the lid toward and away from the door together with the pod. The door can hold the lid of the pod. The door is driven by the door drive mechanism to open/close the opening portion while holding the lid, to be retracted downwardly away from the space between the opening portion and the second opening portion, and to be inserted into the aforementioned space between the opening portion and the second opening portion. A robot is provided in the mini-environment. The robot can move into and retract from the interior of the pod through the opening portion and the opening of the pod and transfer wafers between the interior of the pod and the semiconductor processing apparatus through the opening portion, the opening of the pod, and the second opening portion. As disclosed in the publication of Japanese Patent No. 4246420, when bringing wafers into/out of the pod, what is called wafer mapping operation is performed. In the wafer mapping operation, a sensor is inserted into the pod and moved in the direction along which the wafers are arranged to detect the presence/absence of each of wafers arranged at different levels.

To maximize the number of processed substrates per one pod, in which 25 wafers are stored normally, an attempt to put an additional wafer at the highest level, which is originally intended to serve as a reserve, of the pod has been made. This leads to a small gap left between the wafer at the highest or top level and the top inner wall of the pod. When the highest level is used, it is necessary to insert a sensor into the pod at a position very close to the inner wall of the pod in order to detect the wafer at that level in the mapping operation. Therefore, it is necessary for the sensor to be inserted slowly to prevent the contact of the sensor with the inner wall. This might lead to an increase in the time taken by the process. In the case where the sensor is driven by a cylinder for operations of the sensor such as upward, downward, advancing and retracting motions, it is difficult to simply synchronize these operations, and it is accordingly difficult to achieve both enhancement in the operation accuracy to prevent the contact with the inner wall and reduction in the operation time.

SUMMARY OF THE INVENTION

The present invention has been made in view of the above-described circumstances, and an object of the present invention is to provide a load port apparatus in which the operation speed of the sensor can be increased while preventing a contact of the sensor for mapping and the inner wall of the pod during the mapping even when a wafer or an object to be processed is present at the highest level of the pod. The present invention also relates to a mapping method or a method of detecting objects to be processed in the load port apparatus in which the operation speed of the sensor can be increased.

To achieve the above object, according to a present invention, there is provided a load port apparatus that opens/closes a lid of a pod, which is an airtight container having an opening through which objects to be processed are brought into/out of it and storing the objects to be processed in such a way that they are arranged along a predetermined arrangement direction in an overlapping manner with spaces therebetween, to allow transfer of the objects to be processed into/out of the pod through the opening. The load port apparatus is to be attached to an attachment surface of a semiconductor processing apparatus, on which an opening portion is provided that applies predetermined processing on the objects to be processed. The load port apparatus according to the present invention includes a support table on which the pod can be placed, a door that can hold the lid of the pod placed on the support table and opens/closes the opening portion from the interior side of the attachment surface of the semiconductor processing apparatus, a sensor that detects the presence/absence of the objects to be processed in the interior of the pod, a mapping frame that supports the sensor, a first driving unit that drives the mapping frame in a first direction parallel to the predetermined arrangement direction along which the objects to be processed are arranged in an overlapping manner, and a second driving unit that drives the mapping frame in a second direction oblique to the first direction, wherein the second direction crosses a direction parallel to the first direction in such a way as to form an acute angle in a side in which the sensor exists.

It is preferred that the above-described load port apparatus further include a synchronization control unit that controls the start time of driving of the mapping frame by the second driving unit based on a state of driving of the mapping frame by the first driving unit. In this case, it is preferred that the synchronization control unit control the start time of driving of the mapping frame by the second driving unit based on reduction of speed of driving of the mapping frame by the first driving unit. It is further preferred that the second driving unit include a driving source including a cylinder, such as a pneumatic cylinder.

To achieve the above object, according to the present invention, there is provided a method of detecting objects to be processed in a load port apparatus that opens/closes a lid of a pod, which is an airtight container having an opening through which objects to be processed are brought into/out of it and storing the objects to be processed in such a way that they are arranged along a predetermined arrangement direction in an overlapping manner with spaces therebetween, to allow transfer of the objects to be processed from the interior of the pod through the opening to a processing apparatus for processing the objects to be processed and detects the presence/absence of the objects to be processed stored in the interior of the pod. The method includes: detaching the lid of the pod to open the opening; placing a mapping frame supporting a sensor that detects the presence/absence of the objects to be processed in front of the opening; driving the mapping frame along a first direction parallel to the predetermined overlapping arrangement direction; driving the mapping frame in a second direction that is oblique to the first direction to form an acute angle with a direction parallel to the first direction in a side in which the sensor exists, before completion of the driving of the mapping frame in the first direction; and driving the mapping frame in the first direction while causing the sensor to operate.

In the above-described method of detecting objects to be processed, it is preferred that the driving of the mapping frame in the second direction be started based on a state of driving of the mapping frame along the first direction. In this case, it is more preferred that a control for starting the driving of the mapping frame in the second direction is performed based on reduction of speed of driving of the mapping frame along the first direction.

According to the present invention, the possibility of interference of the mapping sensor with the upper inner wall of the pod can be reduced even if an object to be processed is stored on a top level in the pod, particularly in the case where a cylinder-driven mapping sensor is used. Furthermore, according to the present invention, the reduction in the possibility of interference can lead to an increase in the speed of insertion of the sensor into the pod.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

A preferred embodiment of the present invention will now be described in detail in accordance with the accompanying drawings.

Figure 1:
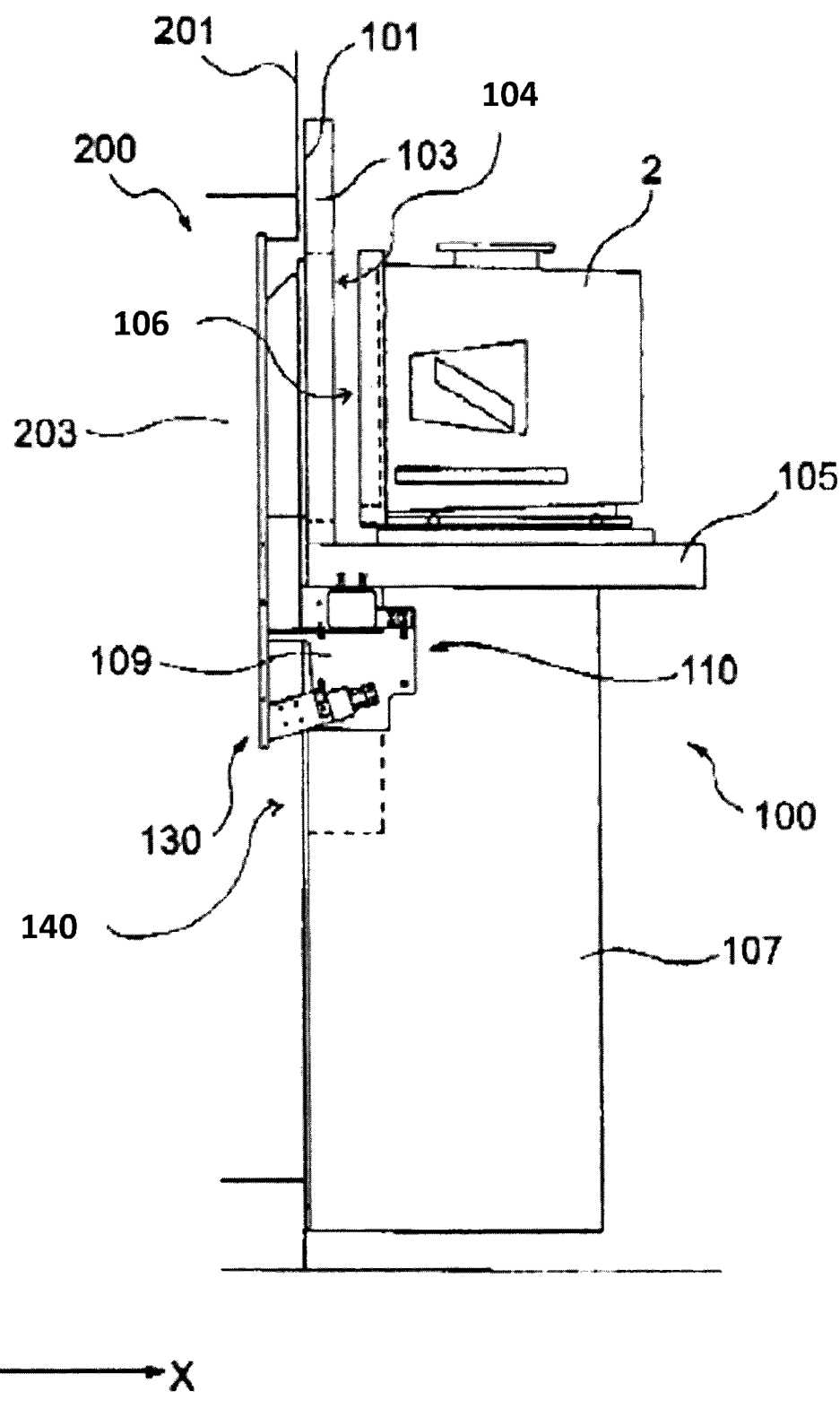
FIG. 1 is a side view illustrating a basic structure of a load port apparatus according to an embodiment of the present invention, on which a pod is placed.
Figure 2:
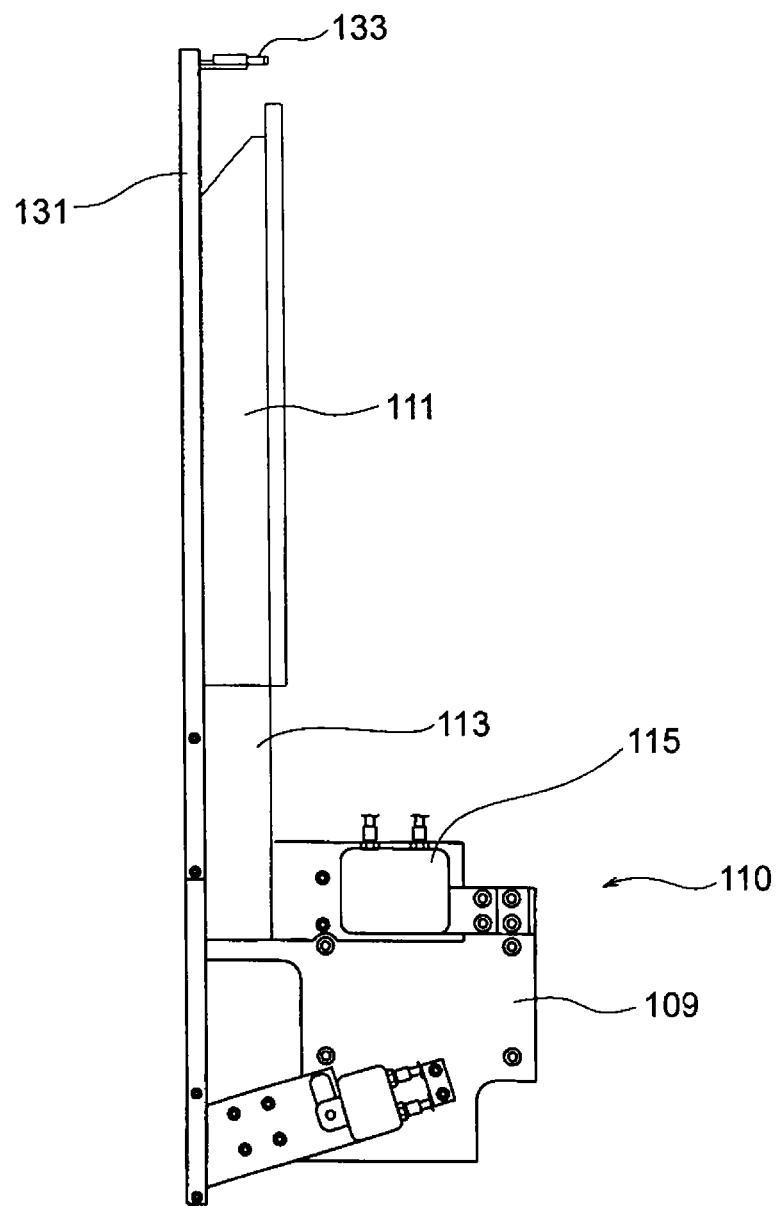
FIG. 2 is a diagram showing a door, a mapping frame, a mapping sensor, and a door driving mechanism that drives them extracted from the structure shown in FIG. 1.
Figure 3:
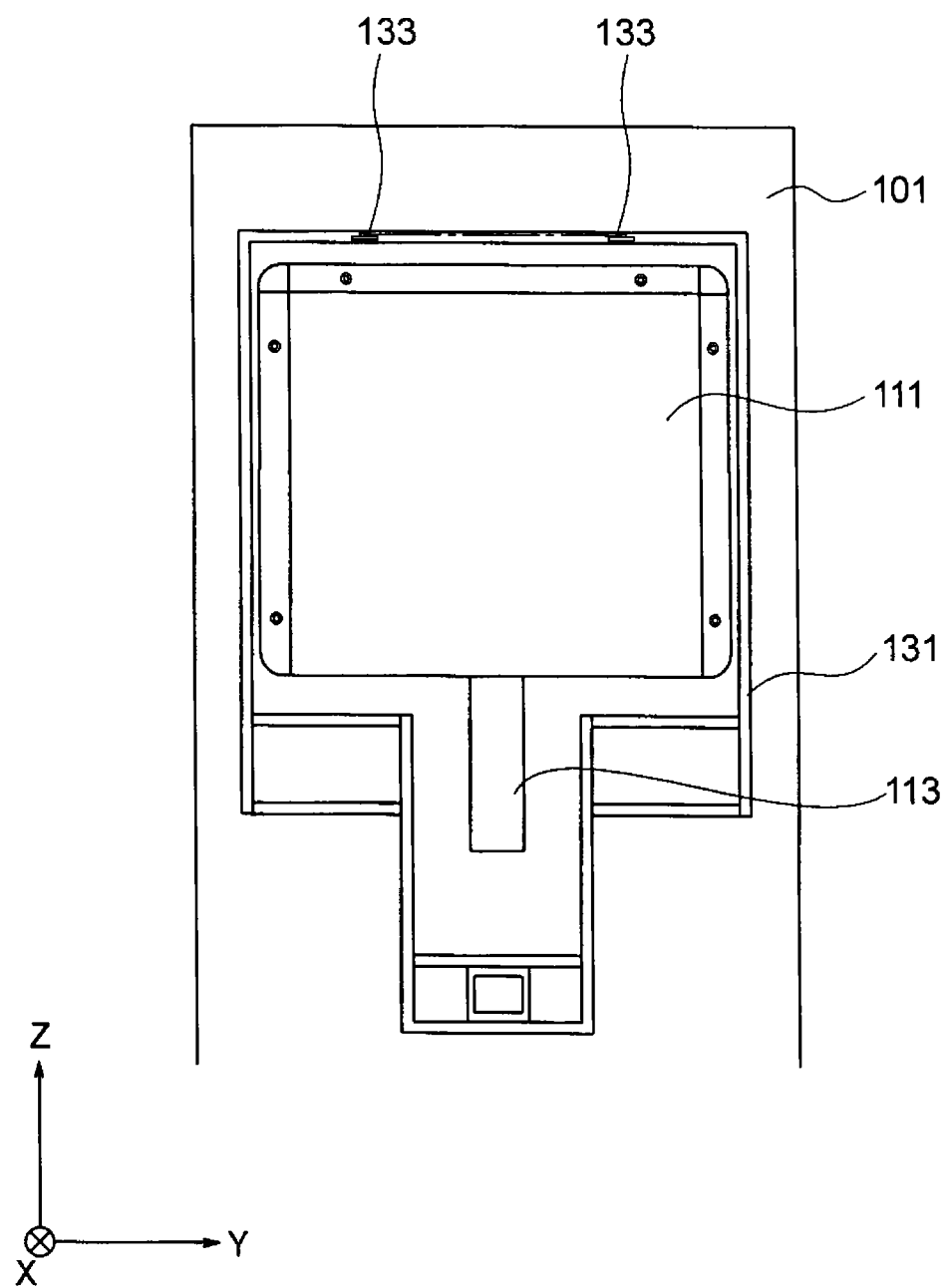
FIG. 3 is a diagram showing relevant components shown in FIG. 2 seen from the pod support table side.
Figure 4:
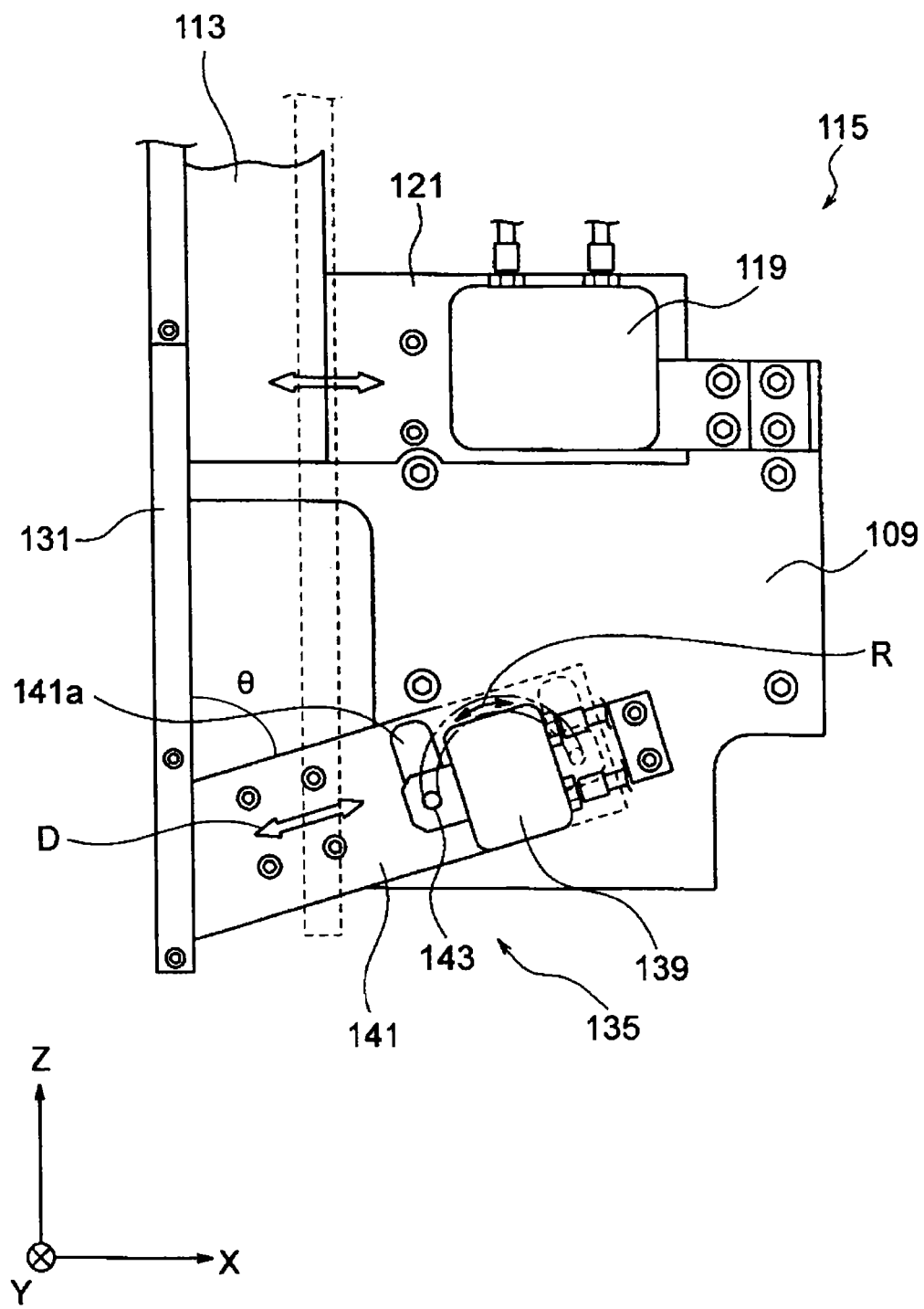
FIG. 4 is an enlarged side view of a door unit, a mapping unit, and a driving unit mount base shown in FIG. 2.

FIG. 1 is diagram showing the basic construction of a load port apparatus according to an embodiment of the present invention seen from the side with a pods 2 placed on a support table. FIG. 2 is a diagram showing some components in the apparatus shown in FIG. 1 including a door, a mapping frame, a mapping sensor, and a door driving mechanism that drives them. FIG. 3 is a diagram showing objects to be processed shown in FIG. 2 seen from the side other than the pod table side. FIG. 4 is a further enlarged side view showing the door driving mechanism and the frame driving unit shown in FIG. 2. The load port apparatus 100 according to this embodiment has a load port wall 101, an opening periphery cover 103, a support table 105, a lower cover 107, a door unit 110, and a mapping system 130. The X axis in the drawings is taken in the direction in which the pod 2 placed on the support table 105 is driven toward the processing apparatus 200, the Y axis is taken in the direction perpendicular to the X axis and defining, with the X axis, the plane of the support table 105 supporting the pod 2, and the Z axis is taken in the direction perpendicular to the X-Y plane. The Z axis corresponds to the direction along which objects to be processed such as wafers store in the pod 2 are arranged in an overlapping manner. In the case of this embodiment, the Z axis is oriented in the vertical direction.

The load port apparatus 100 is attached to an attachment face 201 of the processing apparatus 200 equipped with a mini-environment 203 by the load port wall 101. The load port wall 101 is provided with a communication opening portion 104 in communication with the opening portion of the mini-environment 203. The opening periphery cover 103 is arranged to cover the periphery of the communication opening portion 104 and projecting toward the support table 105. The support table 105 is located on the opposite side of the mini-environment 203 with respect to the attachment face 201 and the load port wall 101 and adapted to support the pod 2 that is placed in such a way that the opening of the pod 2 directly faces the communication opening portion 104. The door unit 110 and the mapping system 130 are fixedly mounted on a driving unit mount base 109. The lower cover 107 is provided vertically beneath the support table 105 and houses an elevator mechanism 140 that moves the driving unit mount base 109 up and down (along the direction parallel to the Z axis in the drawings).

Figure 5:
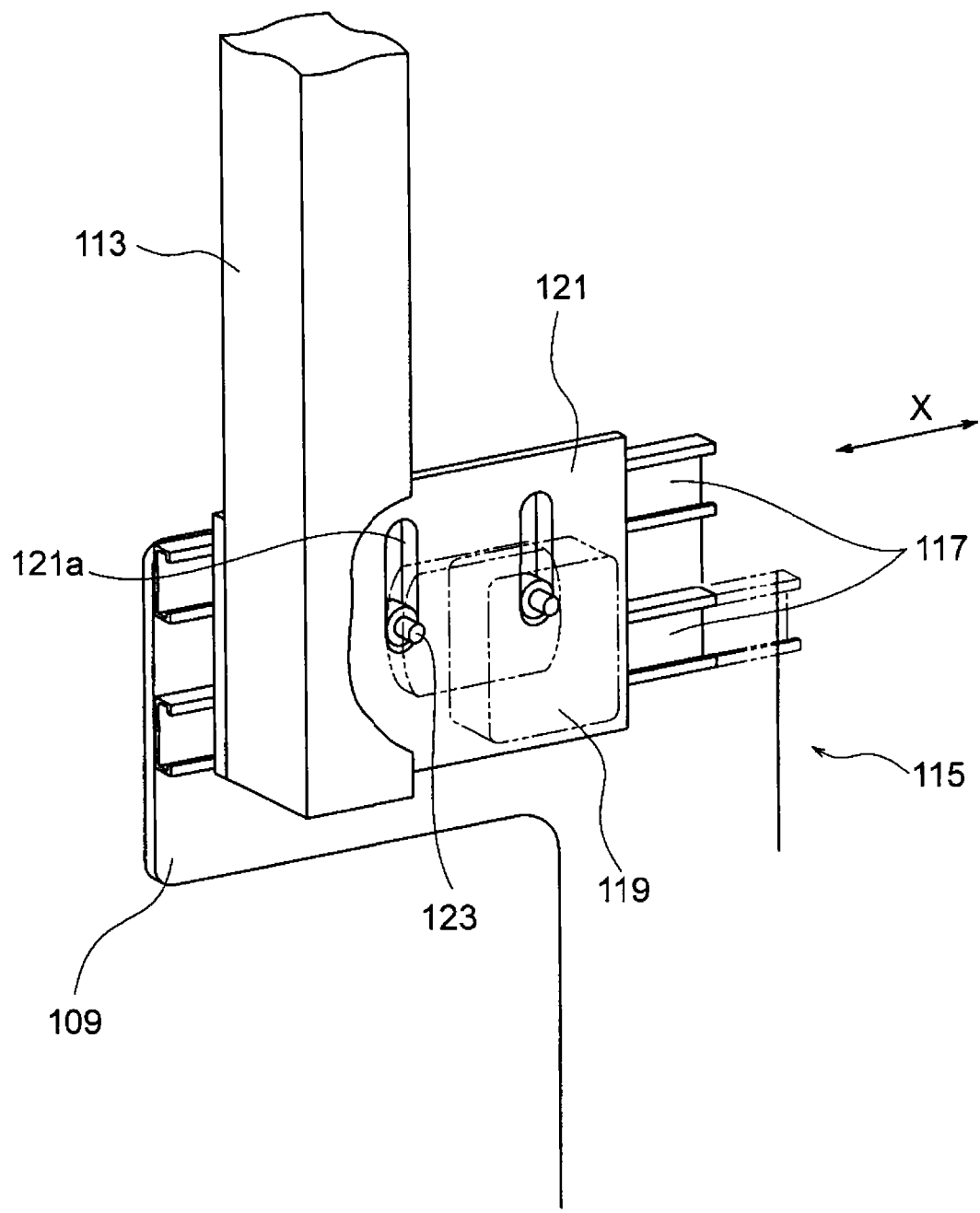
FIG. 5 is a schematic view illustrating relevant components in the door driving mechanism in the door unit.

The door unit 110 includes a door 111, a door arm 113, and a door driving mechanism 115. The door 111 has a substantially flat plate-like shape having a size large enough to close the aforementioned communication opening portion 104. The door 111 is supported at its lower end by one end of the door arm 113. The door 111 can hold the lid 106 of the pod 2 placed on the support table 105. The door 111 closes/opens the opening from the semiconductor processing apparatus side or the mini-environment 203 side of the attachment surface 201. The door arm 113 is supported at its other end by the door driving mechanism 115. The structure of the door driving mechanism 115 will be described in the following with reference to FIG. 5, which is a schematic perspective view of the door driving mechanism 115. In order to facilitate the description, in FIG. 5 the positions of its components are displaced from their actual positions, and a door driving source 119 that will be described later is drawn by phantom lines. The door driving mechanism 115 includes a pair of door guide rails 117 extending in the X direction, the door driving source 119, a door slider 121, and door cam followers 123. The pair of door guide rails 117 are fixedly attached to the driving unit mount base 109 by respective attaching members. The door guide rails 117 support the door slider 121 in such a way as to allow its sliding movement along the X axis. The door slider 121 actually supports the door arm 113. The movement of the door slider 121 along the X axis causes the door arm 113 and the door 111 to move toward/away from the opening potion.

The door slider 121 has door cam grooves 121a arranged to extend in a direction perpendicular to the X axis. The door cam follower 123 is inserted through the door cam groove 121a. The door cam followers 123 are supported by the door driving source 119 in a rotatable manner. The rotary shaft of the door driving source 119 for the door cam followers 123 are opposed to the door slider 121. The door driving source 119 is fixedly attached to the driving unit mount base 109 by an attaching member, as with the door guide rails 117. The aforementioned rotary shaft is located at a position offset from the door cam follower 123, so that the door cam followers 123 revolve about the rotary shaft with the rotation of the rotary shaft. If the region of the door slider 121 opposed to the rotary shaft is a flat surface that is perpendicular to the rotary shaft, this flat surface corresponds to a plane in which the door cam groove 121a extends and in which the door cam groove 121a is moved by the door cam follower 123. The door driving source 119 used in this embodiment is a rotary cylinder that is actuated by pressurized air or the like.

FIG. 3 is a schematic diagram showing the door 111 and the mapping frame 131 (which are main components in the structure shown in FIG. 2) seen from the mini-environment 203 side. As shown in FIG. 3, the mapping frame 131 has a frame structure larger than the door 111. The mapping frame 131 is arranged to surround the outer circumference of the door 111 by the frame member. Two mapping sensors 133 are fixedly mounted on the upper side of the frame structure of the mapping frame 131. The mapping sensors 133 project from the upper side of the frame structure toward the communication opening. The mapping sensors 133 can be inserted into the pod 2 through the communication opening and the opening of the pod 2 by moving the mapping frame 131 closer to the load port wall 101. In this embodiment, a photo sensor is used as the mapping sensor 133, and optical fiber and other elements are attached thereto in reality, though they are not shown in FIG. 3 in order to facilitate the explanation.

Here, details of the mapping system 130 will be described. Besides the above-described mapping frame 131 and the mapping sensors 133, the mapping system 130 includes a frame driving unit 135 connected to the lower part of the mapping frame 131 to support it. Broken lines in FIG. 4 illustrate an operation of the frame driving unit 135 and the positional shift of the mapping frame 131 caused by the operation. The frame driving unit 135 includes components like those in the above-described door driving mechanism 115. Specifically, the frame driving unit 135 includes a frame guide rail (not shown), a frame driving source 139, a frame slider 141, and frame cam follower 143. As will be described below, although the construction of the frame driving unit 135 is basically similar to that of the door driving mechanism 115, the frame driving unit 135 differs from the door driving mechanism 115 in that the frame guide rail (not shown) extends in a specific direction D that has a certain angle relative to the X axis and forms an acute angle with the upward vertical direction of the attachment surface 201 (i.e. the surface having the opening portion and extending parallel to the Z axis) and that there is only one frame cam follower 143.

The frame guide rail (not shown) is fixedly attached to the driving unit mount base 109 and supports the frame slider 141 in such a way that it can slide along the aforementioned direction D. The frame slider 141 actually supports the mapping frame 131, and the shift of the frame slider 141 along the aforementioned direction D causes the motion of the mapping sensors 133 fixed to the upper side of the mapping frame 131 into and out of the opening of the pod 2. The opening of the pod 2 is substantially parallel to the attachment surface 201 of the mini-environment 203, and the direction of the aforementioned motion of the mapping sensors 133 into and out of the pod 2 through its opening has a specific elevation angle relative to the opening of the pod 2 corresponding to the aforementioned direction in which the frame guide rail extends.

The frame slider 141 has frame cam grooves 141a, which is arranged to extend perpendicularly to the aforementioned specific direction D. The frame cam follower 143 is inserted through the frame cam groove 141a. The frame cam followers 143 are rotatably supported by the frame driving source 139. The center of rotation of the frame cam followers 143 rotated by the frame driving source 139 is opposed to the frame slider 141. The frame driving source 139 is fixedly attached to the driving unit mount base 109, as with the frame guide rail (not shown). The aforementioned center of rotation is located at a position offset from the frame cam follower 143, so that the frame cam followers 143 revolve about the center of rotation. If the region of the frame slider 141 opposed to the center of rotation is a flat surface that is perpendicular to the center of rotation, this flat surface corresponds to a plane in which the frame cam groove 141a extends and in which the frame cam groove 141a is moved by the frame cam follower 143. The frame driving source 139 used in this embodiment is a rotary cylinder that is actuated by pressurized air or the like.

The load port apparatus has an elevator unit 140 that drives or moves the mapping frame 131 along the direction along which the objects to be processed are arranged in the pod 2. The elevator unit 140 corresponds to the first driving unit according to the present invention for driving the mapping frame 131 in the direction parallel to the direction along which the objects to be processed are arranged. The frame driving unit 135 corresponds to the second driving unit for driving the mapping frame 131 in a second direction oblique to the first direction. It is preferred that the second direction cross the first direction in such a way as to form an acute angle θ in the side in which the sensors 133 supported by the mapping frame 131 exist. Although in the illustrative case in this embodiment the direction along which the objects to be processed are arranged coincides with the vertical direction, the direction of arrangement may be different from the vertical direction. Therefore, that the direction of arrangement be predetermined direction of arrangement. it is preferred defined as a predetermined direction of arrangement.

Next, the actual operation of the load port apparatus according to the embodiment, in particular the mapping system 130 characteristic to the present invention will be described with reference to FIGS. 6A to 6D, which schematically show the shift positions of the mapping sensor 133 and the change in its positional relationship with the pod opening. The mapping sensor 133 detects the presence/absence of an object to be processed in the interior of the pod and transmits the result of detection to a control apparatus or the like (not shown) to provide a basis for operation in transferring the object to be processed into/out of the pod from/to the semiconductor processing apparatus. The mapping frame 131 drawn by solid lines in FIG. 4 is in its status at the time when the door unit 110 starts to move downward with the door 111 holding the lid of the pod 2. On the other hand, the mapping frame 131 drawn by broken lines is in a status after shift in the specific direction D in which the mapping sensors 133 are inserted into the opening of the pod 2.

Figure 6A:
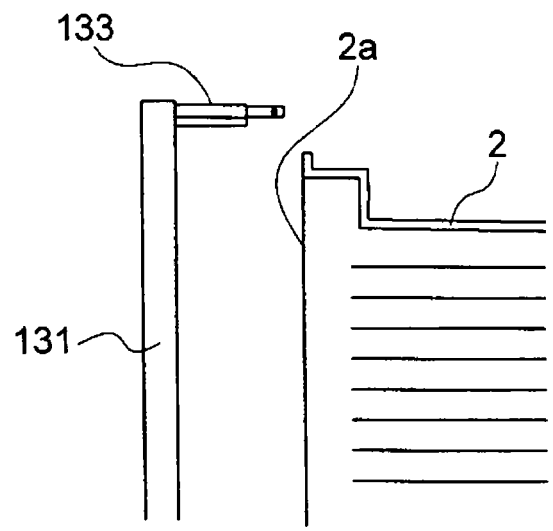
FIG. 6A is a diagram illustrating how the mapping sensor is inserted into the pod.
Figure 6B:
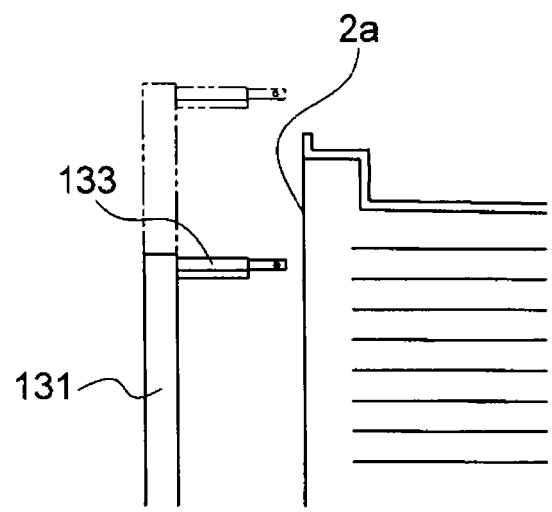
FIG. 6B is a diagram illustrating how the mapping sensor is inserted into the pod.

FIG. 6A shows a state in which the mapping sensor 133 is located at the upper end of its operation range. This state corresponds to the state of the mapping frame 131 and the frame slider 141 drawn by solid lines in FIG. 4. From this state, the driving unit mount base 109 is moved downward by the elevator mechanism 140 along the Z axis, and the mapping frame 131 and the mapping sensor 133 supported by the mapping frame 131 are lowered with the downward movement of the driving unit mount base 109, as shown in FIG. 6B. At the time when the mapping sensors 133 pass a predetermined lowered position, the frame driving unit 135 starts to operate. From the state shown in FIG. 4 in which the frame driving unit 135 is at one end of its operation as drawn by solid lines, the mapping sensors 133 start to move along the specific direction D to shift to the position drawn by solid lines in FIG. 6C. With this movement, the mapping sensors 133 enters into the pod 2 from the opening 2a of the pod 2, and mapping operation for the wafers stored in the pod 2 is performed subsequently.

Figure 6C:
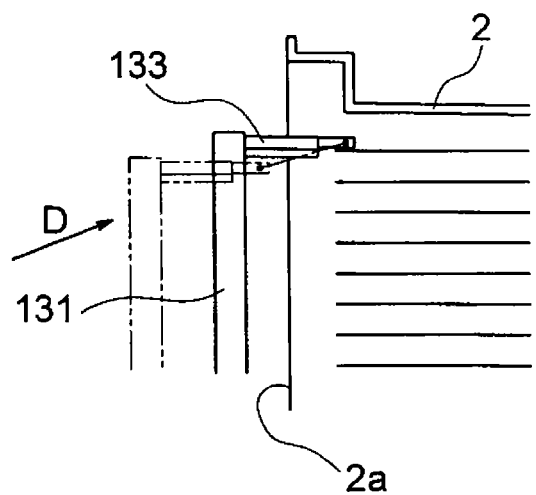
FIG. 6C is a diagram illustrating how the mapping sensor is inserted into the pod.
Figure 6D:
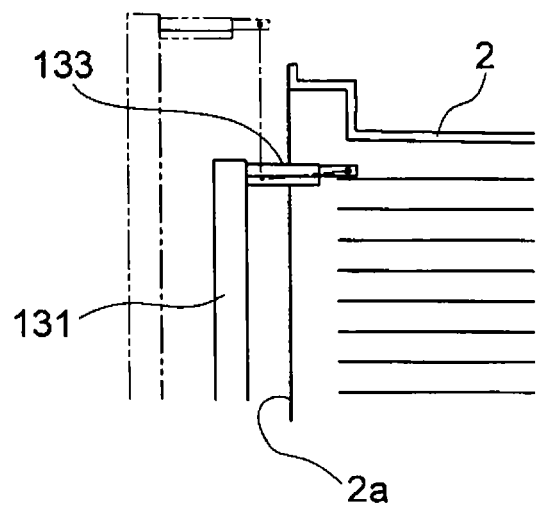
FIG. 6D is a diagram illustrating how the mapping sensor is inserted into the pod.

FIG. 6C illustrates the shift of the mapping sensors 133 caused only by the frame driving unit 135 without the effect of lowering of the driving unit mount base 109. Actually, the lowering of the mapping sensors 133 by the elevator unit 140 and the shift of the mapping sensors 133 in the specific direction D (i.e. the insertion of the mapping sensors 133 into the pod 2) by the frame driving unit 135 are performed by a synchronization control unit, which will be described later, in a temporally overlapping manner. The actual locus of the shift of the mapping sensors 133 in this case is shown in FIG. 6O. This operation enables to increase the speed of shift of the mapping sensors 133 from the upper end to the mapping start position while preventing interference of the mapping sensors 133 and the inner wall of the pod 2. In addition, while the mapping sensors 133 are lowered, they are also advanced sideways in a direction slanted upwardly or inversely to the lowering direction. Thus, the lowering speed is decreased by this advancing operation. In consequence, the mapping sensors 133 can be moved along a shortened locus with the interference of the mapping sensors 133 and the pod 2 or wafers being prevented.

Next, the actual operations of the mapping system 135 during the operation of the mapping sensors 133 will be described in detail. In the state shown in FIG. 6A, a rotary cylinder serving as the frame driving source 139 is at a rotational angle of 0°, and the frame cam follower 143 is located at the lower end of the frame cam groove 141a as illustrated by solid lines in FIG. 4. When causing the mapping frame 131 to shift along the specific direction D from the position shown in FIG. 6A or 6B to the position shown in FIG. 6C, the frame driving source 139 causes the cam follower 143 to revolve along the path indicated by arrow R in FIG. 4. The frame cam follower 143 revolves while being inserted in the frame cam groove 141a. Therefore, as the frame cam follower 143 revolves, it moves from the lower end to upper end and then from the upper end to the lower end of the frame cam groove 141a. With this movement, the frame cam follower 143 causes the frame slider 141 to move along the specific direction D. When the frame driving source 139 comes to a rotational angle of 180°, the frame cam follower 143 comes to the lower end of the frame cam groove 141a as drawn by broken lines in FIG. 4.

It is preferred that the timing for starting the operation of the frame driving unit 135 be determined based on instructions from the synchronization control unit for synchronizing the up/down operation and the inserting/retracting operation. The synchronization control unit may be implemented by providing an additional sensor to detect the time at which the height of the mapping sensors 133 changes from the upper end to come to a predetermined height, the time at which the mapping sensors 133 pass the front of the upper wall of the opening 2a of the pod 2, the elapse of a predetermined time period after the start of downward movement, or the time at which the mapping sensors 133 come to a predetermined point in the course of downward movement from the start to end of the movement and sending an operation instruction to the frame driving unit 135 based on the result of the detection. By providing such means for controlling the start of operation of the frame driving unit 135 while the mapping frame 131 is driven along the first direction, the mapping sensors 133 can be inserted into the pod 2 consecutively without delay while the mapping frame 131 is lowering. In other words, the mapping sensors 133 can be moved along a shorter locus of movement while preventing the interference of the mapping frames 133 and the pod 2 or wafers. The synchronization control unit may send an instruction for starting the operation of the frame driving unit 135 based on reduction of the speed of up/down movement of the mapping frame 131 by the elevator unit 140 or a reference speed. For example, if the operation of advancing the mapping sensors 133 is to be started while the mapping sensors 133 are being lowered without reduction of the lowering speed, it is necessary to decrease the velocity component in the advancing direction to prevent the interference of the mapping sensors 133 with the pod 2 or wafers. Thus it is necessary to reduce the velocity component in the advancing direction by, for example, increasing the elevation angle In the advancing direction. By performing the above described operation, the elevation angle in the direction of advancement of the mapping sensors 133 can be made smaller. In consequence, the travel distance of the advancing operation can be made substantially smaller, and the time taken from the start of lowering until the insertion point is reached after the advancement can further be reduced.

In this embodiment, the center of rotation of the frame driving source 139 in revolving the frame cam follower 143 along arrow R is arranged to be opposed to the frame slider 141, as described before. More specifically, the frame cam groove 141a or both inner surfaces of the frame cam groove 141a is perpendicular to the specific direction D or the direction of movement of the frame slider 141. In addition, the tangential lines of the locus of revolution of the rotary cylinder at the rotational angles of 0° and 180° are also perpendicular to the specific direction D. With these arrangements, unintended motion along the specific direction D at both ends of advancing/retracting operation of the mapping sensors 133 can be prevented from occurring. In other words, the rotational angles of 0° and 180° respectively correspond to ends of operation of the frame slider 141. This improves the accuracy in stopping the frame slider 141 and in stopping the mapping sensors 133 accordingly and facilitates stable stoppage of the frame slider 141 and the mapping sensors 133.

As the frame cam follower 143 moves along the locus of revolution in the direction R and in the reverse direction, the frame slider 141 moves in accordance with the component of the velocity of the frame cam follower 143 along the specific direction D. Therefore, the frame slider 141 moves fastest at the center of its movable range remotest from both ends of the movable range at which it stops, and the moving speed decreases as it comes to closer to the both ends. Therefore, the operation of the mapping sensors 133 in the vicinity of the stopping positions, in which abnormal stoppage might otherwise be apt to occur, can be performed stably. The positional relationship between the center axis of rotation of the frame driving source 139 and the frame cam groove 141a allows a small radius of movement locus of the frame cam follower 143, enabling efficient use of the torque of the frame driving source 139.

In this embodiment, a rotary cylinder is used as the frame driving source 139. This can prevent overload in an abnormal occasion, which might occur in the case of electric position control using e.g. a motor, from occurring. However, even in the case of control using a motor, the advantages such as improvement in the stopping position accuracy can be achieved.

The present invention is characterized in that the mapping sensors 133 are moved along a specific direction that forms a specific angle relative to the horizontal direction so that the advancing direction of the mapping sensors 133 have an elevation angle with respect to the horizontal direction. As described above, it is preferred that the frame driving source 139 be a rotary cylinder and that the above-described cam mechanism be used. However, on condition that the apparatus has the above characterizing feature, the rotary cylinder may be replaced by a reciprocating cylinder type driving source or other driving source like a motor, and/or the cam mechanism may be replaced by a driving mechanism adapted thereto.

As described above, the present invention relates to a load port apparatus that is suitable for use with a semiconductor processing apparatus. But the application of the present invention is not limited to a load port apparatus for use with semiconductor processing apparatuses, but the present invention can also be applied to a load port apparatus in a broad sense that is used with various types of processing apparatuses that process objects like semiconductor devices, for example processing apparatuses for processing liquid display panels.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-208693, filed on Sep. 26, 2011, which is hereby incorporated by reference herein in its entirety.

What is claimed is:

1. A load port apparatus that opens/closes a lid of a pod, which is an airtight container having an opening through which objects to be processed are brought into/out of it and storing the objects to be processed in such a way that they are arranged along a predetermined arrangement direction in an overlapping manner with spaces therebetween, to allow transfer of the objects to be processed into/out of the pod through the opening, the load port apparatus being to be attached to an attachment surface of a semiconductor processing apparatus which applies predetermined processing on the objects to be processed and comprising:
   a support table on which the pod can be placed;
   a door that can hold the lid of the pod placed on the support table and opens/closes the opening from an interior side of the semiconductor processing apparatus;
   a sensor that detects the presence/absence of the objects to be processed in the pod;
   a mapping frame that supports the sensor;
   a first driving unit that linearly drives the mapping frame in a first linear direction parallel to the predetermined arrangement direction along which the objects to be processed are arranged in an overlapping manner; and
   a second driving unit that linearly drives the mapping frame in a second linear direction oblique to the first direction,
   wherein the second linear direction crosses a direction parallel to the first linear direction in such a way as to form an acute angle in a side in which the sensor exists.

2. A load port apparatus according to claim 1 further comprising a synchronization control unit that controls the start time of driving of the mapping frame by the second driving unit based on a state of driving of the mapping frame by the first driving unit.

3. A load port apparatus according to claim 2, wherein the synchronization control unit controls the start time of driving of the mapping frame by the second driving unit based on reduction of speed of driving of the mapping frame by the first driving unit.

4. A load port apparatus according to claim 1, wherein the second driving unit comprises a driving source including a cylinder.

* * * * *